United States Patent [19]

Sawada et al.

[11] Patent Number: 5,135,629
[45] Date of Patent: Aug. 4, 1992

[54] THIN FILM DEPOSITION SYSTEM

[75] Inventors: Susumi Sawada; Osamu Kanou; Hironori Wada; Junichi Anan; Takakazu Seki, all of Kitaibaraki, Japan

[73] Assignee: Nippon Mining Co., Ltd., Tokyo, Japan

[21] Appl. No.: 535,444

[22] Filed: Jun. 8, 1990

[30] Foreign Application Priority Data

| Jun. 12, 1989 | [JP] | Japan | 1-146654 |
| Jun. 13, 1989 | [JP] | Japan | 1-148511 |
| Sep. 19, 1989 | [JP] | Japan | 1-240537 |
| Sep. 19, 1989 | [JP] | Japan | 1-240538 |
| Sep. 19, 1989 | [JP] | Japan | 1-240539 |
| Nov. 24, 1989 | [JP] | Japan | 1-303321 |

[51] Int. Cl.$^5$ ............... C23C 14/34; C23C 16/00
[52] U.S. Cl. ............... 204/192.12; 204/192.1; 204/298.01; 204/298.02; 118/715
[58] Field of Search ........... 204/192.1, 192.11, 192.12, 204/298.01, 298.02; 118/715, 723, 725; 427/37, 38, 39

[56] References Cited

U.S. PATENT DOCUMENTS 3,220,897 11/1965 Conley et al. ............... 148/34
3,293,109 12/1966 Luce et al. ............... 161/166

FOREIGN PATENT DOCUMENTS 0017236 1/1984 Japan ............... 204/298.02
0303064 12/1988 Japan ............... 204/298.02

OTHER PUBLICATIONS

Vossen et al., Thin Film Processes, Academic Press, 1978, p. 41.

Primary Examiner—Nam X. Nguyen
Attorney, Agent, or Firm—Seidel, Gonda, Lavorgna & Monaco

[57] ABSTRACT

In a system for thin film deposition by vapor growth, the contamination of devices and the formation of particles in the deposited thin film inside the system are prevented by the provision therein of an anti-contamination means which is chosen from among (1) an electrolytic cop-per foil having a fine-grained thin layer of copper or/and copper oxide formed by copper plating on the matte surface of the copper foil, (2) an electrolytic copper foil having a fine-grained thin layer of copper or/and copper oxide formed by copper plating on the matte surface of the foil and coated with a material which is the same as or is harmless and similar to the material to be deposited as a thin film by vapor growth onto the substrate, (3) a corrugated metal foil, and (4) a metal foil formed with a plurality of irregularities by embossing.

36 Claims, 1 Drawing Sheet

FIG. 1

THIN FILM DEPOSITION SYSTEM

FIELD OF THE INVENTION

This invention relates to a system for thin film deposition onto substrates by vapor phase growth, such as a sputtering system, which incorporates a means for preventing contamination of devices and formation of particles in the deposited thin film inside the system which means can simply be called as anti-contamination means. This invention also relates to such anti-contamination means used in a thin film vapor deposition system and a method for preventing contamination of devices and formation of particles in the deposited thin film inside the system.

BACKGROUND OF THE INVENTION

Vapor phase growth techniques have been widely used in forming many different thin films, for example, thin films for electrodes and diffusion barriers of integrated circuits, magnetic thin films for magnetic recording media, and indium-tin oxide (ITO) transparent conductive films for liquid crystal display units. Thin film deposition based on the vapor phase growth process is performed by various processes, including chemical vapor phase process such as thermal decomposition, hydrogen reduction, disproportionation reaction, plasma CVD technique, vacuum deposition process, sputtering process, ion beam sputtering process, and electric discharge polymerization process.

At the present time these processes for forming vaporphase grown thin films are well established as mass production techniques. They have, however, a shortcoming of accumulating coarse particulates, commonly known as "particles", on the resulting films.

The "particles" are clustered minute or fine particulates that built up on the substrate. They often grow to sizes as large as several microns in diameter, and their accumulation on the substrate, for example, of an LSI could cause shorting of interconnections, disconnection, or other trouble, which leads to an increased percentage of rejected products. Responsible for particle production is the deposition process itself, the equipment involved, or other factor, and diverse efforts are under way to clarify the mechanism and reduce the production of such particles.

The particles that are derived from the thin film deposition system are largely those of film deposited onto and then peeled off from the surroundings of the substrate and the inner walls (furnace walls), shutters, shield plates, and other parts of the equipment. They scatter in broken state and pile up on the substrate to constitute a major contaminant source. To avoid the formation of particles due to the peeling-off of such deposits, the inner walls of the thin film deposition system must be kept clean.

The inner walls of the equipments, in reality, are very difficult to keep clean. Complete cleaning takes long time, and yet the inner walls and devices inside the equipment sometimes are practically in-accessible with cleaners. A countermeasure has been taken to physically roughen the device surfaces most susceptible to contamination, e.g., by spray coating with metal in advance, so as to secure or capture the deposits inseparably in place. It calls for elaborate, scrupulous maintenance of the system (equipment), and still the antipeeling effect upon the deposits is quite low. To overcome these difficulties, anti-contamination materials in the form of disposable foil, such as Al or electrolytic Fe foil, have been developed. It was considered that if such a foil were affixed to the inner walls beforehand and removed after the formation (deposition) of a thin film on the substrate, the walls could be maintained clean.

These disposable foils have, however, been found to possess a fatal defect in common. The film-forming substance deposited on the foils mounted in place are liable to come off rather readily, with the result that the formation of particles on the film deposited onto the substrate still occured as before. Experience has revealed that in these disposable films, the thicker the layer of the film-forming substance thereon the more frequently the peeling-off phenomenon from the disposable film occurs. It has also been found that the phenomenon is liable to occur specially when the film product to be deposited is a ceramic such as silicide or ITO. A remedy to preclude the separation is frequent replacement of the foil, which seriously affects the operation efficiency of thin film deposition. Another problem presented is that during thin film formation by vapor growth the quality of the film being formed on the substrate is made ununiform due to the fact that many contaminants flying from around the substrate, especially accompanied with the formation of many particles.

Under the circumstances there has been a strong need for a novel, ideal anti-contamination means for covering the inner walls of thin film deposition systems and for preventing the particle formation in and on a deposited thin film. The term "particles" is used herein as including particles formed not only in a deposited thin film, but also on the deposited thin film.

SUMMARY OF THE INVENTION

To overcome the afore-described problems, various means for preventing contamination inside thin film deposition systems have been investigated. It has now been found that the best results are obtained with specific anti-contamination means, viz., (1) a treated electrolytic copper foil, (2) a treated electrolytic copper foil coated with a material which is the same as or is harmless and similar to the material to be deposited as a thin film by vapor phase growth onto the substrate, (3) a corrugated metal foil, and (4) a metal foil formed with a plurality of irregularities, namely many recesses and protrusions by embossing.

Based on this discovery, the present invention provides a system for thin film deposition by vapor phase growth characterized in that the contamination of the devices and the formation of particles in the deposited thin film inside the system are prevented by the provision therein of an anticontamination means which is chosen from among (1) an electrolytic copper foil having a fine-grained thin layer of copper or/and copper oxide formed by copper plating on the matte surface of the copper foil, (2) an electrolytic copper foil having a fine-grained thin layer of copper or/and copper oxide formed by copper plating on the matte surface of the foil and coated with a material which is the same as or is harmless and similar to the material to be deposited as a thin film by vapor phase growth onto the substrate, (3) a corrugated metal foil, and (4) a metal foil formed with a plurality of irregularities by embossing.

In a second aspect, this invention provides an anticontamination means used in a thin film vapor deposition system which is selected from the group of said (1) to (4).

In a third aspect, this invention provides a method for preventing contamination of devices and formation of particles in the deposited thin film inside the system using said anti-contamination means.

DETAILED DESCRIPTION OF THE INVENTION

The present invention prevents contamination of the walls inside a system (furnace) for the deposition of vaporgrown thin film, remarkably reduces the formation of particles caused by fugitive deposits (ones that scattered away around a substrate and deposited on the inner walls) coming off the inner walls, and renders it possible to produce satisfactory thin films with less maintenance. Even at the initial stage of vapor-phase layer growth, contaminants can be kept from flying from around the substrate and the particle formation can be controlled, and therefore the growth of a thin film uniform in quality is made possible. The expression "system or means for thin film deposition by vapor phase growth" as used herein encompasses all the system or means for effecting thin film deposition using vapor growth technologies, including thermal decomposition process, hydrogen reduction process, disproportionation reaction process, transport reaction process, chemical vapor deposition (CVD) processes such as plasma CVD and low-pressure CVD, vapor-phase epitaxy (VPE) process, vacuum vapor deposition process, sputtering process, molecular beam epitaxy (MBE) process, ion beam process, and electric discharge polymerization process.

Figure 1:
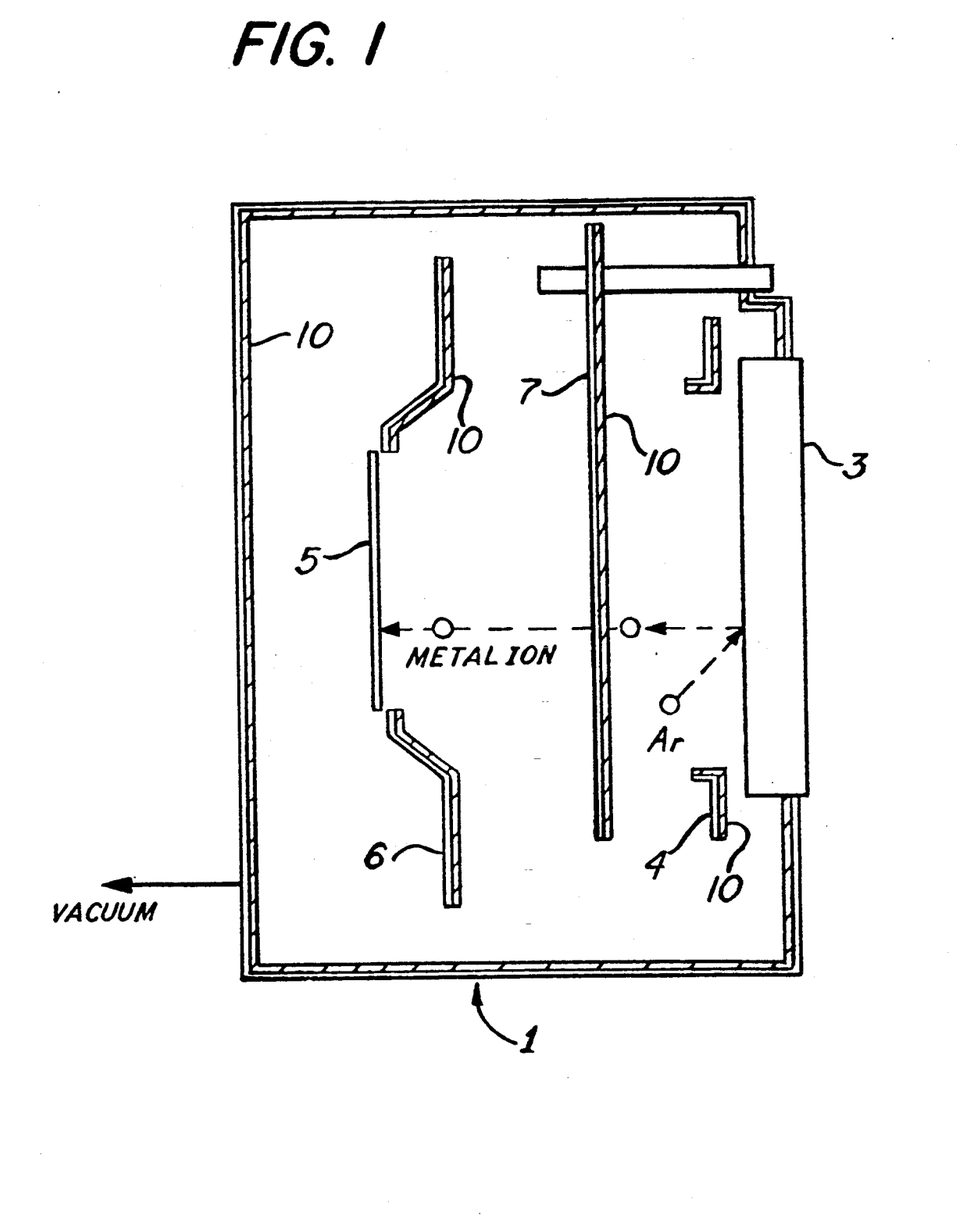
The drawing shows a schematic view of a sputtering system with anti-contamination means incorporated thereinto.

In the drawing, there is schematically shown a sputtering system as a typical means for thin film deposition according to this invention. In a vacuum chamber 1, there are disposed a target 3 suitably fitted by a supporting means (not shown) and a substrate 5, for example Si wafer located opposite to the target 1 with a shutter 7 interposed therebetween. When the target is impinged with Ar atom, the ions of a metal or other material composing the target are eroded out and are directed to the substrate to form a thin film of the sputtered material thereon. The shutter is so movable as to permit the passage of the sputtered-out material from the target toward the substrate in a controlled manner. A target shield 4 is disposed around the target. A substrate shield 6 is disposed around and adjacent the substrate. Anti-contamination means 10 are so located as to cover the inner wall of the vacuum chamber and also prevent the sputtered material from directly depositing onto the surface of the target shield, shutter and substrate shield. In this invention, anti-contamination means 10 is selected from among (1) an electrolytic copper foil having a fine-grained thin layer of copper or/and copper oxide formed by copper plating on the matte surface of the copper foil, (2) an electrolytic copper foil having a fine-grained thin layer of copper or/and copper oxide formed by copper plating on the matte surface of the foil and coated with a material which is the same as or is harmless and similar to the material to be deposited as a thin film by vapor phase growth onto the substrate, (3) a corrugated metal foil, and (4) a metal foil formed with a plurality of irregularities by embossing.

Explanations will be sequentially made below as to four versions embodying this invention.

1. Treated electrolytic copper foil

In one aspect of the invention, a treated electrolytic copper foil is employed as the anti-contamination means for preventing contamination of devices and formation of particles. By "treated" copper foil is meant an electrolytic copper raw foil treated to form a fine-grained thin layer with a number of protuberances on the matte surface thereof.

The fine-grained thin layer on the matte surface of an electrolytic copper foil can be produced, for example, by electroplating as taught in U.S. Pat. No. 3,220,897 or 3,293,109.

Although this treatment itself is already known to the art, the present invention achieves a surprisingly beneficial advantages using such a treated copper foil in place of the Al and ferrous foils that have been considered the sole anticontamination materials in the art.

The fine-grained thin layer is formed on the matte surface of the electrolytic copper (raw) foil by electroplating, typically under the following conditions:

| Aqueous copper sulfate plating bath | |
|---|---|
| $CuSO_4.5H_2O$ g/l (as Cu) | 23 |
| NaCl, ppm (as Cl) | 32 |
| $H_2SO_4$, g/l | 70 |
| Glue, g/l | 0.75 |
| Pure water | bal. |
| Plating conditions | |
| Current density | 60-100 A/ft$^2$ |
| Duration | 10-60 sec. |
| Bath temperature | 70-80° F. |

The matte (dull) surface of an electrolytic copper foil (raw foil) is opposite to the side (lustered surface) that comes in contact with rolls during foil production process. It is observed under an electron microscope to have a roughened surface with numerous knobs (lumpy protuberances).

Electron microscopic inspection also shows that, when the fine-grained thin layer has been formed on the matte surface, fine grains (nodules) of copper or/and copper oxide precipitate randomly on the knobby roughened surface of the electroytic copper (raw) foil.

The copper foil formed under the foregoing conditions may further be covered with a brass or zinc barrier layer which imparts heat resistance, as taught in Japanese Patent Application Publication No. 6701/1979. If desired, the covered surface may be subjected to anticorrosion treatment so as to avoid oxidation or other deterioration during transportation or storage of the copper foil.

Electrolytic copper foils finished through such a step or steps all come within the contemplation of the present invention. The electrolytic copper foil to be used is desired to have a surface roughness, Rz, in the range between 5.0 and 10.0 μm. The presence of minute protuberances represented by the roughness produces an anchoring effect which, in turn, improves the surface adhesion to the deposits of fugitive substance flying toward inner walls etc. to such an extent that the possibility of peeling is precluded.

The foil used as means for preventing contamination and particle formation in the thin film deposition system of the invention has a thickness of from 10 to 300 μm, preferably from 15 to 100 μm. If too thin, the foil tends to crease when affixed to furnace walls. This should be avoided because creasing can cause foil peeling-off from the wall surface. On the other hand, the thicker the foil the less frequently it creases but the more difficult it is to operate so as to affix and set the foil to the walls and the greater the economic disadvantage.

Since the electrolytic copper foil is made in a glue-containing electrolytic bath, glue sometimes remains on the foil surface. To avoid the contamination inside the thin film deposition system with this glue, it is advisable to use the foil after ultrasonic cleaning with an organic solvent, such as acetone or alcohol, or with hot ultra-pure water. The cleaned surface may be heated in a vacuum to dry up. Where vacuum heating is used, the temperature must be kept below 800° C. lest the surface protuberances further grow out of shape.

Inside the thin film deposition system that depends on vapor growth, the copper foil may be used as corrugated or embossed beforehand.

Such processing considerably increases the surface area of the copper foil and properly absorbs the internal stresses that result from the thin film formation. Consequently, the particle formation in the thin film grown on the substrate can be outstandingly reduced.

The present invention is directed also to the copper foils made in the afore-described way.

Test examples will now be explained.

Example 1-1

Various foils listed in Table 1 were affixed to inner wall portions of a vacuum deposition equipment (chamber), and vacuum deposition was carried out using a conductive-film-forming Al source. After the deposition, the foils were taken out. The foils too showed Al films formed from the scattered Al vapor. The films were subjected to a Scotch tape peel test. Only the electrolytic copper foil of the invention showed no Al film peeling-off upon the peel test. The test materials used and the results are summarized in Table 1.

TABLE 1

| Test materials and results of Scotch tape peel tests | |
|---|---|
| Test material | Test result |
| Comparative samples: | |
| SUS 304 foil (rolled foil) | Peeled off |
| Pure Ti foil (rolled foil) | " |
| Pure Zr foil (rolled foil) | " |
| Pure Al foil (rolled foil) | " |
| Sample of this invention: | |
| Electrolytic copper foil | No peeling |

NOTE: The designation "SUS" Type No. is used to express the kinds of stainless steels in Japan which corresponds to "AISI" Type No. in U.S.A.

Example 1-2

Employing a CVD system, an electrolytic copper foil of the invention and a stainless steel (SUS) sheet sprayed with molybdenum (Mo) as a comparative example, as listed in Table 2, were fitted inside the equipment. A reactive gas consisting essentially of WF$_6$ and H$_2$ was introduced, and a tungsten (W) film was formed on each case.

The W films thus formed on each foil were tested for peeling with Scotch tapes and double-coated tapes as shown in Table 2. The both tapes peeled the W skin from the Mo-sprayed SUS sheet, but none from the electrolytic copper foil of the invention, indicating that the film bond strength was much greater in the latter.

TABLE 2

| Results of peel tests on tungsten films | | |
|---|---|---|
| Test material | Type of tape used in peel test | Test result |
| Mo-sprayed SUS sheet | Scotch tape | Peeled off |
| | Double-coated tape (No. 500) | Peeled off |
| Electrolytic copper foil of the invention | Scotch tape | No peeling |
| | Double-coated tape (No. 500) | No peeling |

As is obvious from the above examples, the thin film deposition system having a treated copper foil as an anticontamination material fitted inside can markedly control the formation of particles that contaminate the thin film, as compared with the conventional systems using Al, ferrous, or other similar foil. Another remarkable advantage is the ease with which the copper foil is affixed and detached, thus facilitating the maintenance of the system.

The above advantages combine with high heat conductivity and non-electrical-chargeability to make the electrolytic copper foil ideal as an anti-contamination material to be used inside a system for thin film deposition by vapor phase growth.

2. Treated copper foil having a coating

The electrolytic copper foil obtained in the foregoing manner may advantageously be coated with a substance which is the same as or is harmless and similar to the substance to be deposited as a thin film by vapor phase growth onto the substrate.

Examples of the substances for the above application are silicides, such as molybdenum silicide, tungsten silicide, and titanium silicide; metals of tungsten, molybdenum, titanium, cobalt, aluminum, and tantalum as well as their alloys; oxides, such as indium oxide and aluminum oxide; nitrides, and various others.

Different (or similar) substances may be employed as coatings on the electrolytic copper foil provided the combined use (or mixing) does not pose a problem. For example, a foil may be coated with one of the metals constituting an alloy or tungsten silicide-coated copper foil may be used for the deposition of molybdenum silicide. They all come within the scope of this invention.

Coating of the electrolytic copper foil with these substances may be done using a means for thin film deposition by vapor phase growth onto the foil substrate. Although the thickness of the coating may be optionally chosen, it desirably ranges from about 5,000 to about 100,000Å. The coated, treated copper foil thus keeps contaminants from flying mostly from peripheral parts and controls the formation of particles, from the early stage of vapor-grown thin film deposition onward. The thin film so coated serves for the "containment" of the contaminants.

It eliminates the necessity of conventionally used precoating (pretreatment) such as presputtering and permits further enhancement of the operation efficiency.

Inside the thin film deposition system that depends on vapor growth, the copper foil may be used as corrugated or embossed beforehand.

Such processing considerably increases the surface area of the copper foil and properly absorbs the internal stresses that result from the thin film formation. Consequently, the particle formation in the thin film grown on the substrate can be outstandingly reduced.

The present invention is directed also to the copper foils made in the afore-described way.

Test examples are given below.

Example 2-1

Using ITO targets for forming transparent, electrically conductive films, various foils listed in Table 3 were affixed to the devices and inner walls of a sputtering chamber, in such a manner that the foils individually cover those surfaces, and then sputtering was carried out. After the sputtering under the identical condition of 390 W.hr, the substrates formed with ITO thin films and foils were taken out. The foils too had ITO films formed from the flying particulates. The foils were tested for peeling with Scotch tape. The electrolytic copper foil according to the invention showed no separation of the ITO film. As shown in Table 3, film separation took place with the SUS 304 foil, indicating serious peeling of the coat that leads to particle formation. It was found that the same electrolytic copper foils with and without an ITO film formed in advance showed different rates of initial particle production on substrates.

It will be seen from the foregoing that forming a film of a target material ITO in advance will reduce the initial particle production to almost naught and provide an excellent preventive against particle formation.

TABLE 3

| | Initial productions of particles on substrates and peel test results | |
|---|---|---|
| Test material | Peel test result | Initial particle production on substrate |
| Comparative samples: | | |
| SUS 304 foil (rolled foil) | Peeled off | Large |
| Electrolytic copper foil (without ITO thin film) | No peeling | Small |
| Sample of the invention: | | |
| Electrolytic copper foil with ITO thin film | No peeling | None |

Example 2-2

Using silicide targets, an electrolytic iron foil and a silicide-precoated electrolytic copper foil of the invention were separately affixed to the devices in and inner walls of a sputtering system, in such a manner that the foils individually cover those surfaces, and then sputtering was likewise performed. After the sputtering, the substrates and test foils were taken out. The both test foils had an about 10 μm thick silicide film formed thereon. These samples were tested for peeling with Scotch tape and more adherent double-coated tape (No. 500). Only the electrolytic copper foil of the invention did not show separation in either test. The results are summarized in Table 4.

Initial particle formation on the substrate was not in the least observed with the electrolytic copper foil of the invention, whereas the iron foil exhibited initial particle formation and inclusion of contaminants.

TABLE 4

| | Results of peel tests on silicide films | | |
|---|---|---|---|
| Test material | Type of tape used in peel test | Result of peel test | Particle formation on substrate |
| Electrolytic iron foil | Scotch tape Double-coated | Not peeled Peeled off | Yes |

TABLE 4-continued

| | Results of peel tests on silicide films | | |
|---|---|---|---|
| Test material | Type of tape used in peel test | Result of peel test | Particle formation on substrate |
| Electrolytic copper foil of invention (silicide-coated) | tape (No. 500) Scotch tape Double-coated tape (No. 500) | Not peeled Not peeled | No |

Example 2-3

An electrolytic copper foil coated with a W film in accordance with the invention and, by way of comparison, a stainless steel (SUS) sheet spray coated with molybdenum (Mo), as listed in Table 5, were separately affixed to the devices and inner walls of different CVD units so as to cover them. Reactive gases composed basically of $WF_6$ and $H_2$ were introduced, and tungsten (W) films were formed on substrates under the same conditions.

Following the formation of the W films, the substrates were taken out together with the test foil and sheet. The substrates were inspected for any evidence of particle formation and contamination of the thin films, and the test foil and sheet were tested for peeling with Scotch tape and double-coated tape. As shown in Table 5, the W film was peeled off by the both tapes from the Mo-sprayed SUS sheet covering the devices, whereas it did not come off from the electrolytic copper foil of the invention, indicating much greater adhesion strength attained in the latter.

Where the electrolytic copper foil of the invention was used, there was neither particle growth on the substrate nor contamination arising from the devices. With the Mo-sprayed SUS sheet, by contrast, both the particle formation on the substrate and device-related contamination were observed.

TABLE 5

| | Results of peel tests on tungsten films | | |
|---|---|---|---|
| Test material | Type of tape used in peel test | Result of peel test | Particle formation on substrate |
| Mo-sprayed SUS sheet | Scotch tape Double-coated tape (No. 500) | Peeled off " | Yes |
| Electrolytic copper foil of invention (W-coated) | Scotch tape Double-coated tape (No. 500) | Not peeled " | No |

As appreciated from the examples, the treated copper foil coated in conformity with the invention, when fitted in a thin film deposition system, proves to be an excellent anti-contamination means. It substantially controls the formation of particles as a contaminant to the resulting thin film, and eliminates the ingress of contaminants or particles into the substrate which would otherwise occur at the early stage of coating by vapor growth.

Another notable advantage is the ease with which the foil is attached and detached, which facilitates the maintenance of the system.

In addition, the electrolytic copper foil has high thermal conductivity and has no possibility of being electrically charged. With these advantages, it is a most suitable anti-contamination material for use inside a system for thin film deposition by vapor growth.

3. Corrugated metal foil

Corrugation sharply increases the surface area of a metal foil, reduces the amount of deposition per unit area, and inhibits the increases in internal stresses with increased amounts of deposition. It thereby remarkably reduces the cracking of the deposition product, warpage (camber) of the anti-contamination material (means), and peeling-off of the deposit due to such defects.

The corrugated form imparts flexibility to the metal foil, allowing the latter for expansion and contraction in the direction of corrugations. It thus prevents abnormal deformation of the anti-contamination material due to its own internal-stress-induced warpage and hence avoids the separation of the deposition product from the material.

Corrugating of the metal foil is implemented by roll forming or other metal working process. There is no special limitation to the geometric shape of corrugations, although ridges 0.1 to 5 mm high and an angle of bend in the range of 10 to 150° ( preferably 30 to 100° ) give good results.

For example, with a circular target or circular substrate in a sputtering system, the corrugations may be concentric, with the ridgelines extending radially in conformity with the configuration of the substrate shields or shutters. With a rectangular target or substrate, the corrugations may be so aligned that their ridgelines are in parallel.

Metal foils 10 to 300 μm thick can be employed, but those usually used have a thickness of 18 to 300μm, preferably 18 to 250μm, more preferably 18 to 100μm.

If the metal foil is too thin, a strength problem arises and, in addition to having inadequate rigidity, the foil becomes difficult to corrugate.

Conversely if the foil is too thick, excessive rigidity makes it no longer flexible enough to absorb the internal stresses of the deposition product. As a consequence, separation tends to occur between the anti-contamination metal foil and the deposition product, giving rise to particles.

The corrugated anti-contamination material is preferably fitted in the vicinity of the substrate where deposition takes place most actively, for example, around the shutter, substrate shield and magnetic shield of a sputtering system. Alternatively, it may be affixed to the surfaces of the inner walls and other devices inside the system.

For the fitting of the anti-contamination material to the devices inside the thin film deposition system, spot welding is advisable. Fitting by means of pins does not produce sufficient fastening strength, and the geometry of some devices provides locations inaccessible for pinning. The deposition product can come off, and from around, the pins.

Where bolting is resorted to, it is necessary to drill holes in the parts to be joined and in the anti-contamination material too, causing the danger of rupture starting with such holes. This, along with the same drawbacks as with pinning, makes bolting undesirable.

Spot welding may be carried out, when necessary, with a brazed copper-base alloy (Cu-10-30wt%Sn) foil interposed between the device and the thin film deposition system.

This permits joining with a low power output and reduces the possibility of damaging of the devices and the anticontamination material inside the thin film deposition system.

Covering operation involves no separation (poor adhesion) but ensures stable fitting. A further advantage is that when replacement becomes necessary, the anti-contamination material can be easily removed from devices by hand.

The metal foil to be used may consist of stainless steel, iron, aluminum, or the like. Above all, a surface treated electrolytic copper foil as described in 1. or 2. above is desirable. Such a copper foil advantageously gains added ductility on annealing.

The treated electrolytic copper foil exhibits outstanding adhesion strength and effectively controls the exfoliation of the deposition product. In these respects the foil proves quite useful because its own anchoring effect combines with the corrugation effect.

A rolled copper foil attains beneficial effects comparable to those of the electrolytic copper foil upon surface treatment. The treatment imparts greater ductility to the rolled copper foil and allows the foil to absorb the internal stresses of the deposition product efficiently.

Test examples are given below.

Example 3-1

Various foils listed in Table 6 were fitted inside a sputtering system and sputtering was conducted using a tungsten alloy (W-10wt%Ti) target 3 in. in diameter. The foils were taken out after the sputtering under identical conditions, i.e., at the distance of 40 mm from the target, with a power output of 100 W.hr, and at a film forming rate of 12 μm/hr.

TABLE 6

| Test material | Peelability | Deformation |
| --- | --- | --- |
| Comparative samples: | | |
| Flat 70 μm-thick copper foil | Peeled after 12 hrs. of sputtering | Warpage with a radius of curvature of ab. 100 mm after 12-hr sputtering |
| Flat 70 μm-thick rolled copper foil | Peeled after 16-hr sputtering | Warpage with a radius of curvature of ab. 120 mm after 16-hr sputtering |
| Samples of the invention: | | |
| Corrugated 70 μm-thick copper foil (Ridge height 3 mm) | Peeled after 50-hr sputtering | Practically no warpage even after 50-hr sputtering |
| Corrugated 70 μm-thick copper foil (Ridge height 1 mm) | Partly peeled after 50-hr sputtering | No warpage even after 50-hr sputtering |

As table 6 clearly indicates, the both corrugated copper foils (of electrolytic copper) provided quite superior in that they peeled far less than the flat foils and, because the corrugations absorbed the internal stresses of the deposition product, the foils underwent little or no deformation after 50 hours of sputtering.

Thus, the corrugated foils according to the invention have a service life several times as long as the flat copper foils and act amazingly as anti-contamination means inside sputtering systems. They permit prolonged sputtering to get both technical and economical advantages.

Examples 3-2

Inside a CVD system, a flat copper foil as a comparative sample and a corrugated copper foil according to the invention were fitted. Tungsten (W) film was formed over the foils by introducing reactive gases based on $WF_6$ and $H_2$. The results showed that the corrugated copper foil of the invention was more than five times as durable (resistant to peeling) as the flat copper foil.

As is obvious from above examples, a system for thin film deposition by vapor growth which incorporates a corrugated metal foil as an anti-contamination means is capable of remarkably controlling the formation of particles as a contaminant to the thin film deposited by sputtering or other technique, compared with conventional systems using a flat metal foil as the particle getter. The system is also superior in that it can advantageously preclude warpage or other deformation of the anti-contamination means fitted to the shutter, substrate shield, and other devices involved.

Particularly, the copper foil, which is highly heat-conductive and has no possibility of being electrically charged, is an ideal anti-contamination means to be used in a thin film deposition system.

4. Embossed metal foil

Embossing produces a plurality of irregularities (protuberances and corresponding recesses) on the two sides of a metal foil. It thus greatly increases the surface area of the foil, reduces the amount of deposition per unit area, and controls the rise of internal stresses which will otherwise result from an increase in the amount of deposition. Consequently, notable decreases are achieved in the frequency of cracking of the deposition product, warpage of the anti-contamination material, and concomitant exfoliation of the deposit.

The surface irregularities producted by embossing impart flexibility to the metal foil, allow for its uniform expansion and contraction (isotropy), and gives a shape-corrective effect (enhancing the rigidity to some degree). In this way the embossing prevents separation of the deposition product as well as the abnormal deformation due to internal-stress-induced warpage or the like of the anti-contamination material itself.

The embossing to form a plurality of protuberances or recesses on the surface of a metal foil is done by pressing, roll forming, or other forming method. The protuberances or recesses may be formed at random or in various regular patterns. The choice depends on the configurations of the devices to be protected, and there is no particular limitation.

With a circular target or pancake substrate for a sputtering system, for example, the embossed pattern may be concentric or spiral to comply with the shape of the associated substrate shield or shutter. With a rectangular-shaped device, a plurality of continuous grooves (with ridges) in a concentric, rectangular pattern may be formed.

The thickness of the metal foil to be used may range from 10 to 300$\mu$m. It is usually 18 to 300$\mu$m, preferably 18 to 250$\mu$m, more preferably 18 to 100$\mu$m.

If the metal foil is too thin, a strength problem arises with inadequate rigidity. Furthermore, it becomes difficult to emboss.

If the foil is too thick, excessive rigidity with work hardening deprives the foil of adequate flexibility to absorb the internal stresses of the deposition product. The result is a tendency of deposit separation from the metal-foil anti-contamination material, which in turn leads to the formation of particles.

The anti-contamination material formed with a plurality of protuberances or recesses by embossing in accordance with the invention is desired to be used around a substrate where deposition takes place more than elsewhere. For example, in a sputtering system, it is fitted to the shutter, substrate shield, magnetic shield, and the like. Instead, it may be fitted to the inner walls and other devices inside the system. For the fitting of the anti-contamination material to the devices inside the system, spot welding is preferably adopted. The aforedescribed procedure with the corrugated foil generally applies to the manner in which this foil is affixed in place.

While metal foils such as of stainless steel, iron, and aluminum may be employed, surface treated electrolytic copper and rolled copper foils are again preferred. These copper foils are desirable in that they attain increased ductility upon annealing. The description made in 3. above applies in this case as well.

Test examples will be given.

Example 4-1

Various foils shown in Table 7 were fitted inside a sputtering system and sputtering was implemented using a tungsten alloy (W-10wt%Ti) target 3 in. in diameter. The foils were taken out after the sputtering under the same conditions, i.e., at the distance of 40 mm from the target, with a power output of 100 W.hr, and at a film forming rate of 12$\mu$m/hr.

TABLE 7

| Test material | Peelability | Deformation |
| --- | --- | --- |
| Comparative samples: | | |
| Flat 70 $\mu$m-thick copper foil | Peeled after 12-hr sputtering | Warpage with a radius of curvature of ab. 100 mm after 12-hr sputtering |
| Flat 70 $\mu$m-thick rolled copper foil | Peeled after 16-hr sputtering | Warpage with a radius of curvature of ab. 120 mm after 16-hr sputtering |
| Samples of the invention: | | |
| Concentrically embossed 70 $\mu$m-thick copper foil (Ridge height 3 mm) | Peeled after 60-hr sputtering | Practically no warpage even after 60-hr sputtering |
| Randomly emdossed 70 $\mu$m-thick copper foil (Ridge height 1 mm) | Partly peeled after 60-hr sputtering | No warpage even after 60-hr sputtering |

As Table 7 clearly shows, the copper foils (of electrolytic copper) the surfaces of which were made irregular by embossing underwent very slight separation as compared with the flat cooper foils. The sample having the isotropic embossed pattern offered the remarkable advantage of practically no deformation observed after 60 hours of sputtering, because the pattern absorbed the internal stresses of the deposition product.

The embossed metal foil thus has a service life several times longer than those of conventional flat copper foils, and proves very effective as an anti-contamination material for use inside a sputtering system. It is an advantage both technically and economically that the foil permits sputtering operation for longer periods of time than heretofore.

Examples 4-2

A CVD system was used, and a flat copper foil as a comparative sample and a copper foil embossed in accordance with the invention were fitted therein. Tungsten (W) film was formed over the foils by introducing reactive gases based on $WF_6$ and $H_2$. The results showed that the embossed copper foil of the invention was more than five times as durable (resistant to peeling) as the flat copper foil.

As will be understood from this example, a system for thin film deposition by vapor growth which incorporates an embossed metal foil, particularly copper foil as an anti-contamination means can remarkably control the formation of particles as a contaminant to the thin film deposited by sputtering or other technique, compared with conventional systems using a flat metal foil. The system is also superior in that it can advantageously preclude warpage or other deformation of the anti-contamination material fitted to the shutter, substrate shield, and other devices.

What is claimed is:

1. A system for thin film deposition by vapor phase growth characterized by having an anti-comtamination means fitted therein, said means consisting of a treated electrolytic copper foil having fine grains of copper or copper oxide or a mixture of copper and copper oxide precipitated by copper plating on the numerous protuberances of a matte surface of an electrolytic copper foil, whereby the contamination of devices and the formation of particles in the deposited thin film inside the system are prevented.

2. A system according to claim 1 wherein said electrolytic copper foil has on the matte surface thereof a surface roughness, Rz, in the range of 5 to 10 $\mu$m.

3. A system according to claim 1 or 2 wherein the side of said foil having said fine grains therein is oriented as a side where particles scattered flying from the vapor phase growth procedure are trapped.

4. A system according to claim 1 or 2 wherein said foil is a disposable electrolytic copper foil.

5. A system according to claim 1 or 2 wherein said system is a sputtering system.

6. A system for thin film deposition by vapor phase growth characterized by having an anti-contamination means fitted therein, said means consisting of a treated electrolytic copper foil having fine grains of copper or copper oxide or a mixture of copper and copper oxide precipitated by copper plating on the numerous protuberances of a matte surface of an electrolytic copper foil, said foil being coated with a material which is the same as or is harmless and similar to the material to be deposited as a thin film by vapor growth on a substrate, whereby the contamination of devices and the formation of particles in the deposited thin film inside the system are prevented.

7. A system according to claim 6 wherein said electrolytic copper foil has on the matte surface thereof a surface roughness, Rz, in the range of 5 to 10$\mu$m.

8. A system according to claim 6 or 7 wherein the the side of said foil having said fine grained thereon is oriented as a side where particles scattered flying from the vapor growth procedure are trapped.

9. A system according to claim 6 or 7 wherein said foil is a disposable electrolytic copper foil.

10. A system according to claim 6 or 7 wherein said system is a sputtering system.

11. A system for thin film deposition by vapor phase growth characterized by having an anti-contamination means fitted therein, said means consisting of a corrugated copper foil ranging from 18 to 300 $\mu$m thick, whereby the contamination of devices and the formation of particles in the deposited thin film inside the system are prevented.

12. A system according to claim 11 wherein said copper foil has fine grains of copper or copper oxide or a mixture of copper and copper oxide precipitated by copper plating on a surface of the copper foil, with or without coating of a material which is the same as or is harmless and similar to the material to be deposited as a thin film by vapor growth onto a substrate.

13. A system according to claim 11 or 12 wherein said anti-contamination means is spot welded to devices inside said system so as to cover the same.

14. A system according to claim 11 or 12 wherein said system is a sputtering system.

15. A system for thin film deposition by vapor phase growth characterized by having an anti-contamination means fitted therein, said means consisting of a copper foil ranging from 18 to 300 $\mu$m thick embossed to have a plurality of irregularities, whereby the contamination of devices and the formation of particles in the deposited thin film inside the system are prevented.

16. A system according to claim 15 wherein said copper foil has fine grains of copper or copper oxide or a mixture of copper and copper oxide precipitated by copper plating on a surface of the copper foil, with or without coating of a material which is the same as or is harmless and similar to the material to be deposited as a thin film by vapor growth or to a substrate.

17. A system according to claim 15 or 16 wherein said anti-contamination means is spot welded to devices inside said system so as to cover the same.

18. A system according to claim 15 or 16 wherein said system is a sputtering system.

19. A method for preventing the contamination of devices and the formation of particles in the deposited thin film inside a system for thin film deposition by vapor phase growth by disposing the anti-contamination means in the system characterized in that said anti-contamination means consists of a treated electrolytic copper foil having fine grains of copper or copper oxide or a mixture of copper and copper oxide precipitated by copper plating on the numerous protuberances of a matte surface of an electrolytic copper foil.

20. A method according to claim 19 wherein said electrolytic copper foil has on the matte surface thereof a surface roughness, Rz, in the range of 5 to 10 $\mu$m.

21. A method according to claim 19 or 20 wherein the side of said foil having said fine grains thereon is oriented as a side where particles scattered flying from the vapor phase growth procedure are trapped.

22. A method according to claim 19 or 20 wherein said foil is a disposable electrolytic copper foil.

23. A method according to claim 19, 20 wherein said system is a sputtering system.

24. A method for preventing the contamination of devices and the formation of particles in the deposited thin film inside a system for thin film deposition by vapor phase growth by disposing anti-contamination means in the system characterized in that said anti-contamination means consists of a treated electrolytic copper foil having fine grains of copper or copper oxide or a mixture of copper and copper oxide precipitated by copper plating on the numerous protuberances of a matte surface of an electrolytic copper foil, said foil being coated with a material which is the same or is harmless and similar to the material to be deposited as a thin film by vapor growth onto a substrate.

25. A method according to claim 24 wherein said electrolytic copper foil has on the matte surface thereof a surface roughness, Rz, in the range of 5 to 10 μm.

26. A method according to claim 24 or 25 wherein the side of said foil having said fine grains thereon is oriented as a side where particles scattered flying from the vapor growth procedure are trapped.

27. A method according to claim 24 or 25 wherein said foil is disposable electrolytic copper foil.

28. A method according to claim 24 or 25, wherein said system is a sputtering system.

29. A method for preventing the contamination of devices and the formation of particles in the deposited thin film inside a system for thin film deposition by vapor phase growth by disposing anti-contamination means in the system characterized in the said anti-contamination means is consisting of a corrugated copper foil ranging from 18 to 300 μm thick.

30. A method according to claim 29 wherein said copper foil has fine grains of copper or copper oxide or a mixture of copper and copper oxide precipitated by copper plating on a surface of the copper foil, with or without coating of a material which is the same or is harmless and similar to the material to be deposited as a thin film by vapor growth onto a substrate.

31. A method according to claim 29 or 30 wherein said anti-contamination means is spot welded to devices inside said system so as to cover the same.

32. A method according to claim 29 or 30 wherein said system is a sputtering system.

33. A method for preventing the contamination of devices and the formation of particles in the deposited thin film inside a system for thin film deposition by vapor phase growth by disposing anti-contamination means in the system characterized in that said anti-contamination means is consisting of a copper foil ranging from 18 to 300 μm thick embossed to have a plurality of irregularities.

34. A method according to claim 33, wherein said copper foil has fine grains of copper or copper oxide or a mixture of copper and copper oxide precipitated by copper plating on a surface of the copper foil, with or without coating of a material which is the same as or is harmless and similar to the material to be deposited as a thin film by vapor growth onto a substrate.

35. A method according to claim 33 or 34 wherein said anti-contamination means is spot welded to devices inside said system so as to cover the same.

36. A method according to claim 33 or 34 wherein said system is a sputtering system.

* * * * *

UNITED STATES PATENT AND TRADEMARK OFFICE
CERTIFICATE OF CORRECTION

PATENT NO. : 5,135,629

DATED : August 4, 1992

INVENTOR(S) : Susumi Sawada; Osamu Kanou;
Hironori Wada, Junichi Anan and Takakazu Seki.

It is certified that error appears in the above-identified patent and that said Letters Patent is hereby corrected as shown below:

On title page,
    item [75], after "Seki" add

--; Yoshiaki Fujishima--

Signed and Sealed this

Fourteenth Day of September, 1993

Attest:

BRUCE LEHMAN

Attesting Officer

Commissioner of Patents and Trademarks